United States Patent [19]

Steranka

[11] Patent Number: 4,864,371
[45] Date of Patent: Sep. 5, 1989

[54] PARTIALLY OPAQUE SUBSTRATE RED LED
[75] Inventor: Frank M. Steranka, San Jose, Calif.
[73] Assignee: Hewlett-Packard Company, Palo Alto, Calif.
[21] Appl. No.: 122,150
[22] Filed: Nov. 18, 1987
[51] Int. Cl.⁴ .................. H01L 33/00; H01L 29/06
[52] U.S. Cl. ............................ 357/17; 357/56; 357/55
[58] Field of Search ..................... 357/17, 56, 55
[56] References Cited
U.S. PATENT DOCUMENTS
3,667,117  6/1972  Kunz ...................... 357/17
3,813,587  5/1974  Umeda et al. ................ 357/56
4,037,241  7/1977  Dierschke ................... 357/17
4,223,614  11/1980  Botez et al. ................. 357/17

Primary Examiner—Andrew J. James
Assistant Examiner—Jerome Jackson, Jr.
Attorney, Agent, or Firm—Patrick J. Barrett

[57] ABSTRACT

In a light emitting diode comprising a plurality of layers deposited on a substrate, the substrate is etched so as to reduce the area in which the substrate is attached to the plurality of layers. The reduction in the area of attachment results in less light being absorbed by the substrate and thus more total light shining forth from the light emitting diode.

8 Claims, 19 Drawing Sheets

PARTIALLY OPAQUE SUBSTRATE RED LED

BACKGROUND

There are several types of light emitting diodes (LEDs) that emit in the visible (red) portion of the spectrum. Many of these are made with a crystal structure composed of aluminum, gallium and arsenic to form aluminum gallium arsenide (AlGaAs). AlGaAs LEDs can be classified into two groups: those with opaque substrates (OS) and those with transparent substrates (TS).

FIG. 1 shows an example of a prior art OS AlGaAs LED. An epitaxial layer 102 of p-doped AlGaAs and an epitaxial layer 101 of n-doped AlGaAs are grown on top of a p-doped gallium arsenide (GaAs) substrate 103. Light is generated as a result of current flowing through the junction of layers 101 and 102. The surface area of the OS AlGaAs LED, for example, is ten mils by ten mils. Layer 101 is, for example, twenty microns thick, layer 102 is, for example, twenty microns thick and substrate 103 is, for example, eight mils thick.

The OS AlGaAs LED shown in FIG. 1 has a single heterojunction (SH). That is, the bandgaps of layers 101 and 102 are chosen such that light generated in layer 102 travels through layer 101, without being absorbed. Layer 102 is thus called the active layer, and layer 101 is called the window layer.

The primary disadvantage of the OS AlGaAs LED shown in FIG. 1 is its inefficiency. Roughly 90% of the generated light is absorbed by substrate 103.

FIG. 2 shows an example of another prior art OS AlGaAs LED. An epitaxial layer 203 of n-doped AlGaAs, an epitaxial layer 202 of p-doped AlGaAs and an epitaxial layer 201 of p-doped AlGaAs are grown on top of an n-doped gallium arsenide (GaAs) substrate 204. Light is generated as a result of current flowing through the junction of layers 202 and 203. The surface area of this OS AlGaAs LED, for example, is ten mils by ten mils. Layer 201 is, for example, ten microns thick, layer 202 is, for example one and one half to two microns thick, layer 203 is, for example, ten microns thick and substrate 204 is, for example, eight mils thick.

The OS AlGaAs LED shown in FIG. 2 has a double heterojunction (DH). That is, the bandgaps of layers 201, 202 and 203 are chosen such that light generated in layer 202 travels through layers 203 and 201, without being absorbed. Layer 202 is thus the active layer, and layers 201 and 203 are window layers.

The OS AlGaAs LED shown in FIG. 2 is more efficient than the OS AlGaAs LED shown in FIG. 1. However, much of the generated light is absorbed by substrate 204, making the OS AlGaAs LED shown in FIG. 2 still quite inefficient.

FIG. 3 shows an example of a prior art TS AlGaAs LED. An epitaxial layer 303 of n-doped AlGaAs, an epitaxial layer 302 of p-doped AlGaAs and an epitaxial layer 301 of p-doped AlGaAs are grown on top of a gallium arsenide (GaAs) substrate (not shown). The substrate is etched away leaving only layers 301, 302 and 303. Light is generated as a result of current flowing through the junction of layers 302 and 303. The surface area of the TS AlGaAs LED, for example, is ten mils by ten mils. Layer 301, is, for example, thirty microns thick, layer 302 is, for example, one and a half to two microns thick and layer 303 is, for example, one hundred microns thick.

The TS AlGaAs LED shown in FIG. 3 has a double heterojunction (DH). That is, the bandgaps of layers 301, 302 and 303 are chosen such that light generated in layer 302 travels through layers 303 and 301, without being absorbed. Layer 302 is thus the active layer, and layers 301 and 303 are window layers.

The TS AlGaAs LED shown in FIG. 3 is much more efficient than the OS AlGaAs LEDs shown in FIGS. 1 and 2. There is no GaAs substrate, thus no light gets absorbed there, and much more of the generated light escapes the LED. However, producing a TS AlGaAs LED such as that shown in FIG. 3 is difficult and expensive. Therefore, in the prior art, an AlGaAs LED, with efficiency comparable to the LED shown in FIG. 3, may not be produced inexpensively.

SUMMARY OF THE INVENTION

In accordance with the preferred embodiments of the present invention a partially opaque substrate light emitting diode and a method for producing a partially opaque substrate light emitting diode are presented. In a light emitting diode comprising a plurality of layers deposited on a substrate, the substrate is etched so as to reduce the area in which the substrate is attached to the plurality of layers. The reduction in the area of attachment results in less light being absorbed by the substrate and thus more total light shining forth from the light emitting diode. The reduction in the area of attachment also results in less infrared light emission from the substrate.

DESCRIPTION OF THE PREFERRED EMBODIMENT

Figure 4A:
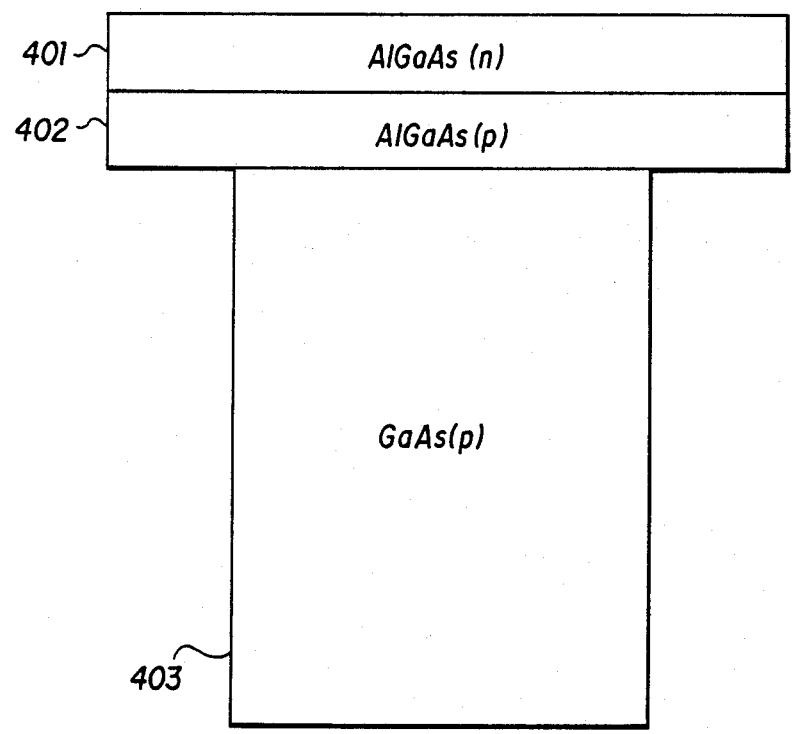
FIGS. 4A, 4B, 4C, 5A, 5B and 5C show light emitting diodes in accordance with preferred embodiments of the present invention.

FIG. 4A shows a light emitting diode (LED). The LED has a layer 401 comprised of n-doped aluminum gallium arsenide (AlGaAs) and a layer 402 of p-doped AlGaAs grown on a substrate 403 of p-doped gallium arsenide (GaAs). Light is generated as a result of current flowing through the junction of layers 401 and 402. Layer 401 is, for example, twenty microns thick, layer 402 is, for example, twenty microns thick and substrate 403 is, for example, eight mils thick.

The LED shown in FIG. 4A has a single heterojunction (SH). That is, the bandgaps of layers 401 and 402 are chosen such that light generated in layer 402 travels through layer 401, without being absorbed. Layer 402 is thus called the active layer, and layer 401 is called the window layer.

Figure 1:
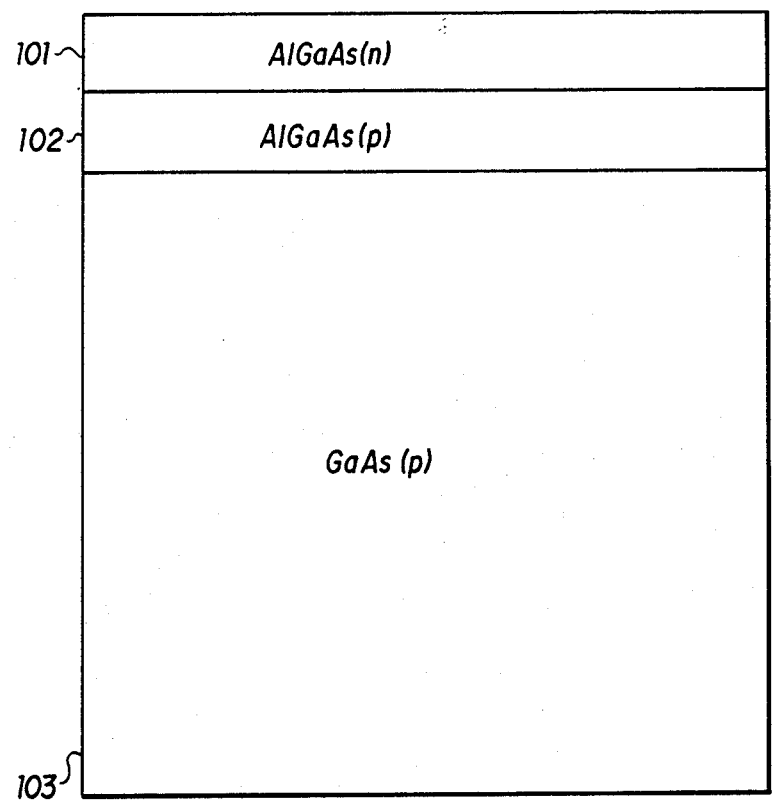
FIG. 1 shows a prior art light emitting diode comprising epitaxial layers of aluminum gallium arsenide crystal structure grown on an opaque substrate and having a single heterojunction.
Figure 4B:
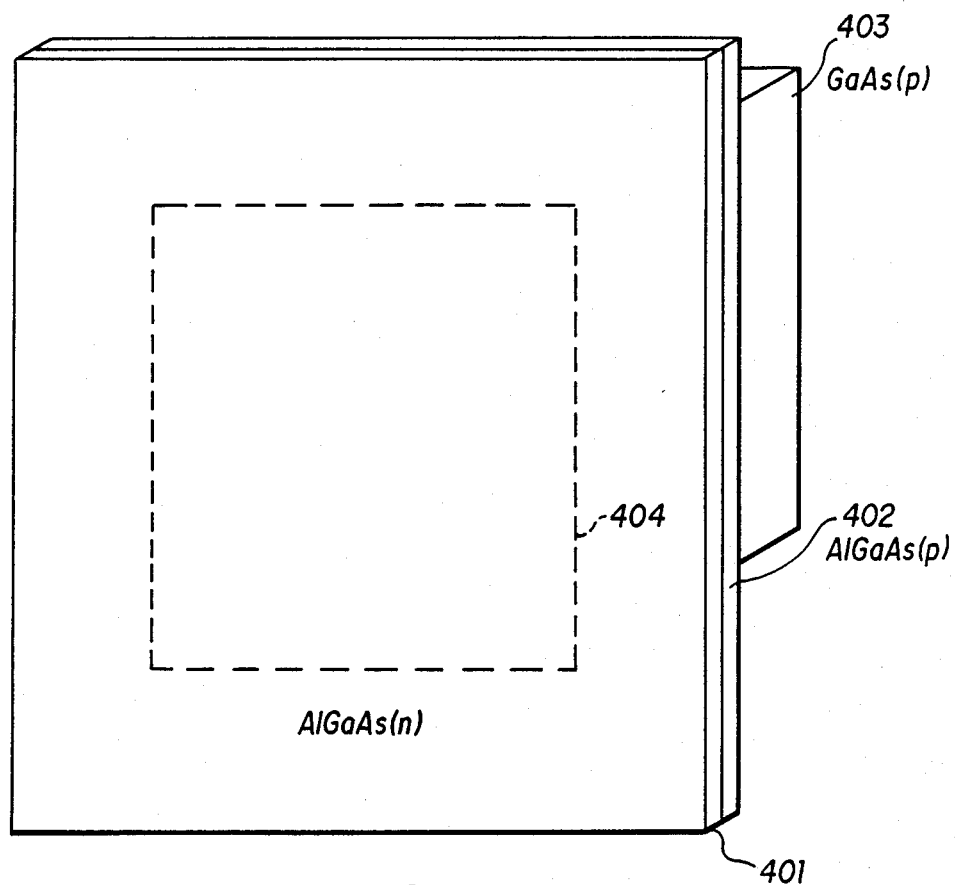

As can be seen from FIG. 4B, the surface area of substrate 403, represented by dotted line 404, is smaller than the surface area of layers 401 and 402. The surface area of layers 401 and 402, for example, is ten mils by ten mils. The surface area of substrate 403 is, for example, six mils by six mils. Because substrate 403 has a smaller surface area than the surface area of layers 401 and 402, less light is absorbed by substrate 403, and more light escapes the LED. Thus the LED shown in FIGS. 4A and 4B is more efficient than the LED shown in FIG. 1. The LED shown in FIGS. 4A and 4B also has less infrared emission from the substrate than the LED shown in FIG. 1 because of the reduced substrate surface area.

Figure 4C:
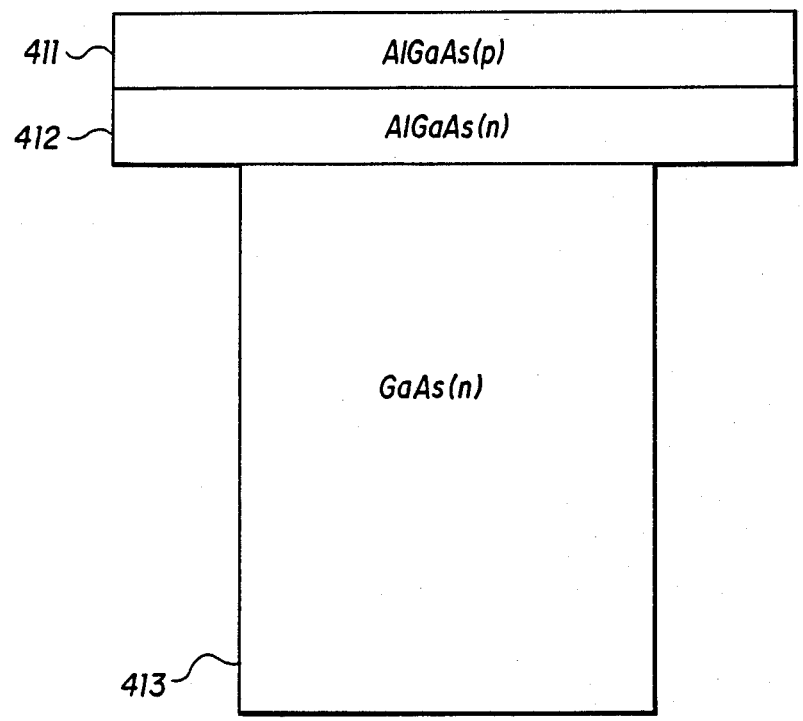

In the LED shown in FIG. 4A, substrate 403 is p-doped, layer 402 is p-doped and layer 401 is n-doped. However, selection of the doping of the substrate and layers is a matter of design choice. For instance, FIG. 4C shows an alternate embodiment of an LED similar to that shown in FIGS. 4A and 4B. The LED shown in FIG. 4C has a layer 411 comprised of p-doped AlGaAs and a layer 412 of n-doped AlGaAs grown on a substrate 413 of n-doped GaAs.

Figure 5A:
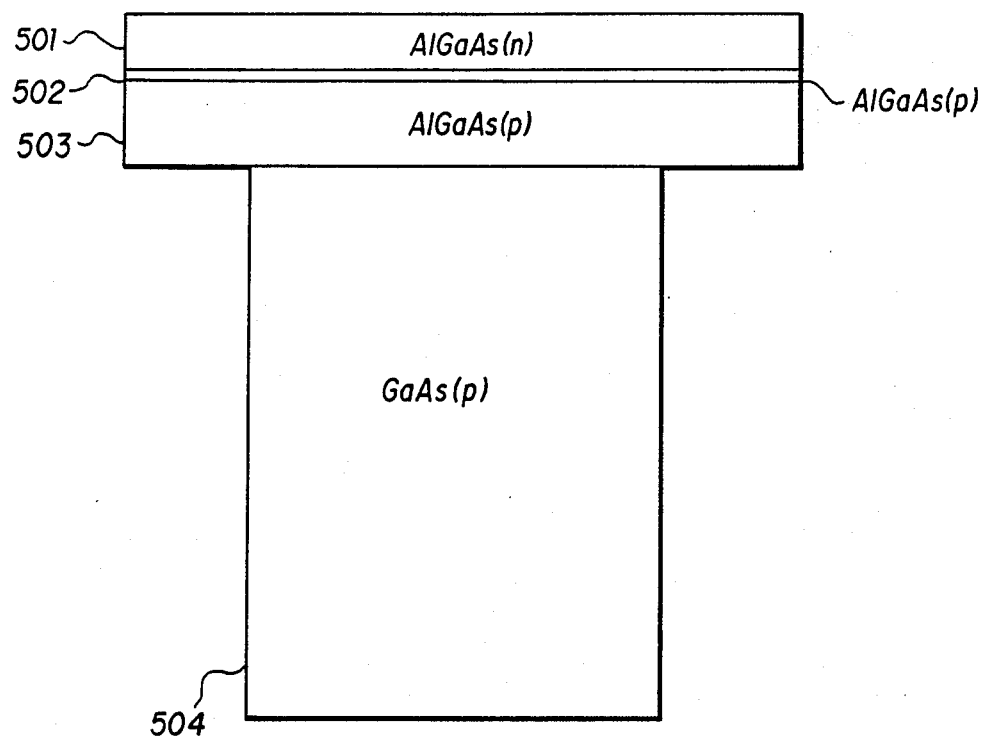

FIG. 5A shows another LED in accordance with a preferred embodiment of the present invention. The LED has a layer 501 of n-doped AlGaAs, a layer 502 of p-doped AlGaAs, and a layer 503 of p-doped AlGaAs grown on a substrate 504 of p-doped gallium arsenide (GaAs). Light is generated as a result of current flowing through the junction of layers 501 and 502. Layer 501 is, for example, ten microns thick, layer 502 is, for example, one and a half to two microns thick, layer 503 is, for example, ten microns thick and substrate 504 is, for example, eight mils thick.

The LED shown in FIG. 5A has a double heterojunction (DH). That is, the bandgaps of layers 501, 502 and 503 are chosen such that light generated in layer 502 travels through layers 503 and 501 without being absorbed. Layer 502 is thus the active layer, and layers 501 and 503 are window layers.

Figure 2:
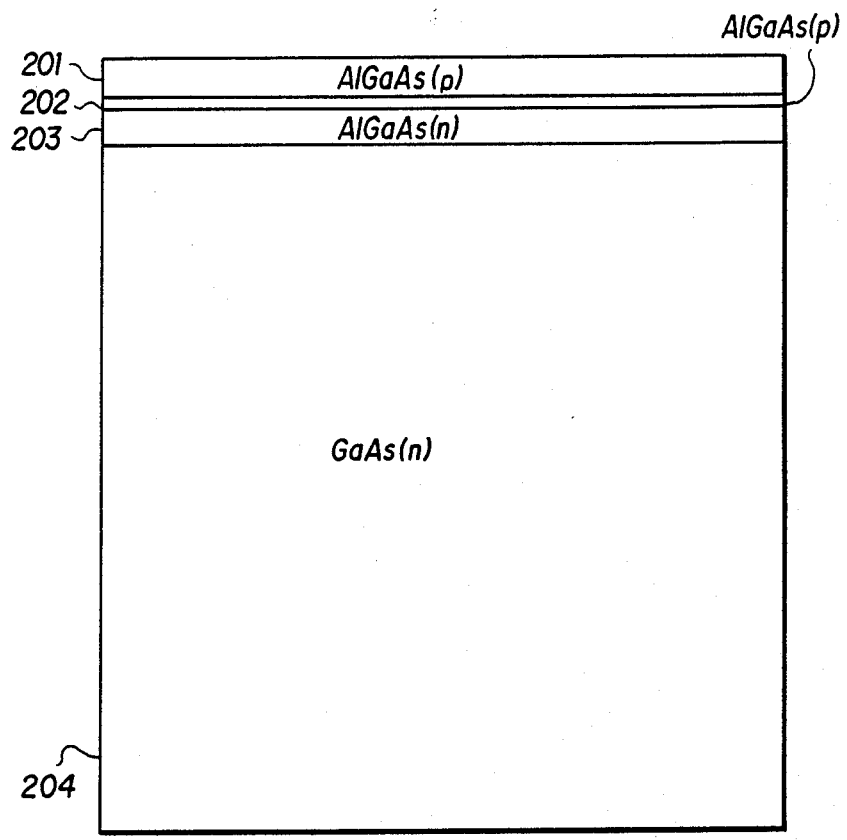
FIG. 2 shows a prior art light emitting diode comprising epitaxial layers of aluminum gallium arsenide crystal structure grown on an opaque substrate and having a double heterojunction.
Figure 3:
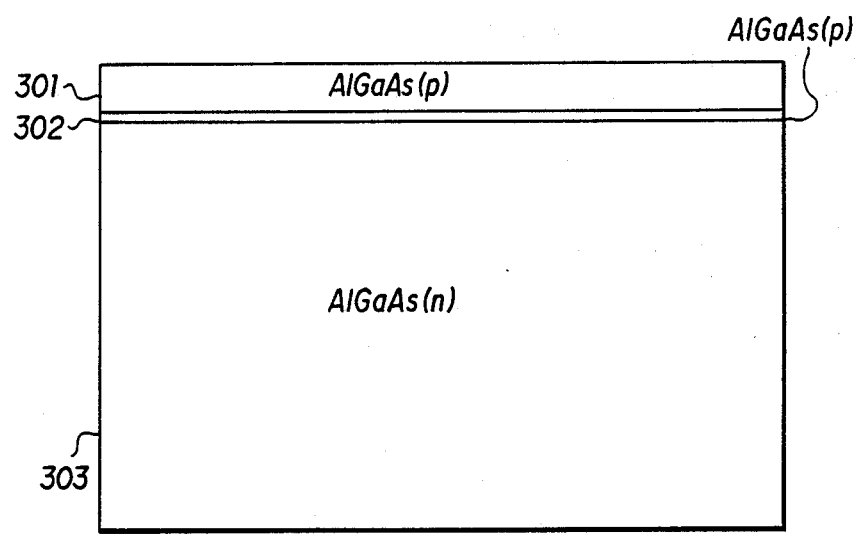
FIG. 3 shows a prior art light emitting diode comprising epitaxial layers of aluminum gallium arsenide crystal structure grown on an opaque substrate, which is then removed. This light emitting diode has a double heterojunction.
Figure 5B:
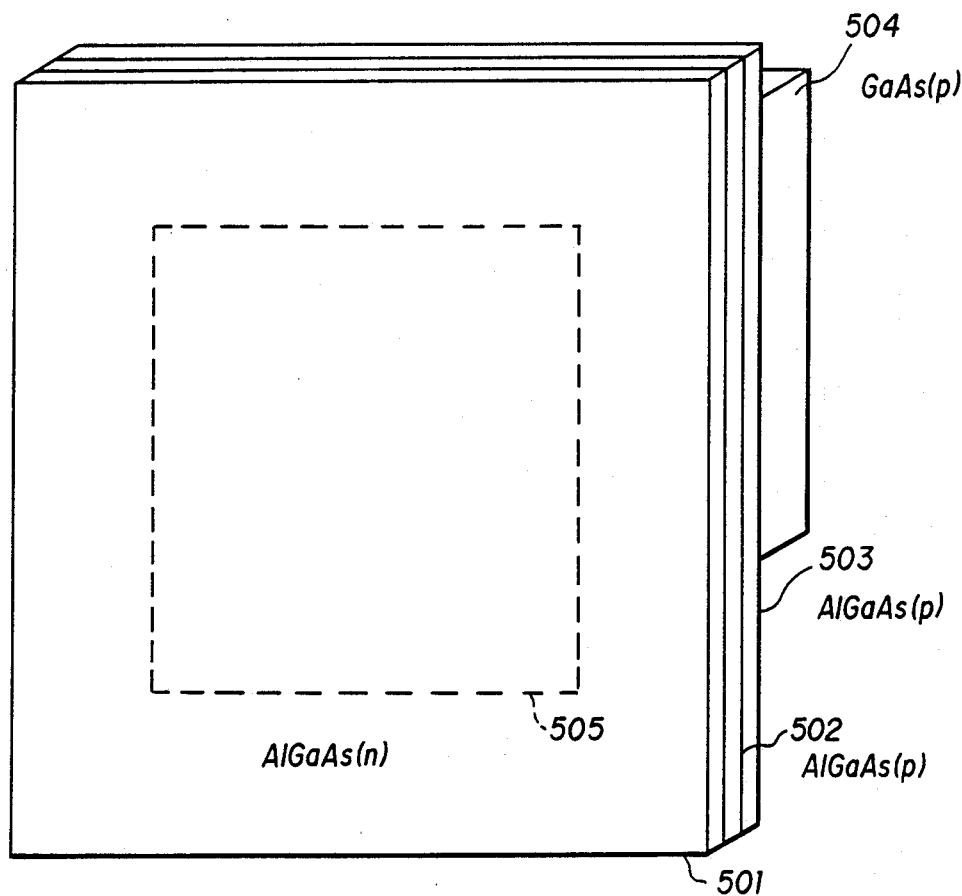

As can be seen from FIG. 5B, the surface area of substrate 504, represented by dotted line 505, is smaller than the surface area of layers 501, 502 and 503. The surface area of layers 501, 502 and 503, for example, is ten mils by ten mils. The surface area of substrate 504 is, for example, six mils by six mils. Because substrate 504 has a smaller surface area less light is absorbed by substrate 504, and more light escapes the LED. Thus the LED shown in FIGS. 5A and 5B is more efficient than the LED shown in FIG. 2.

Figure 5C:
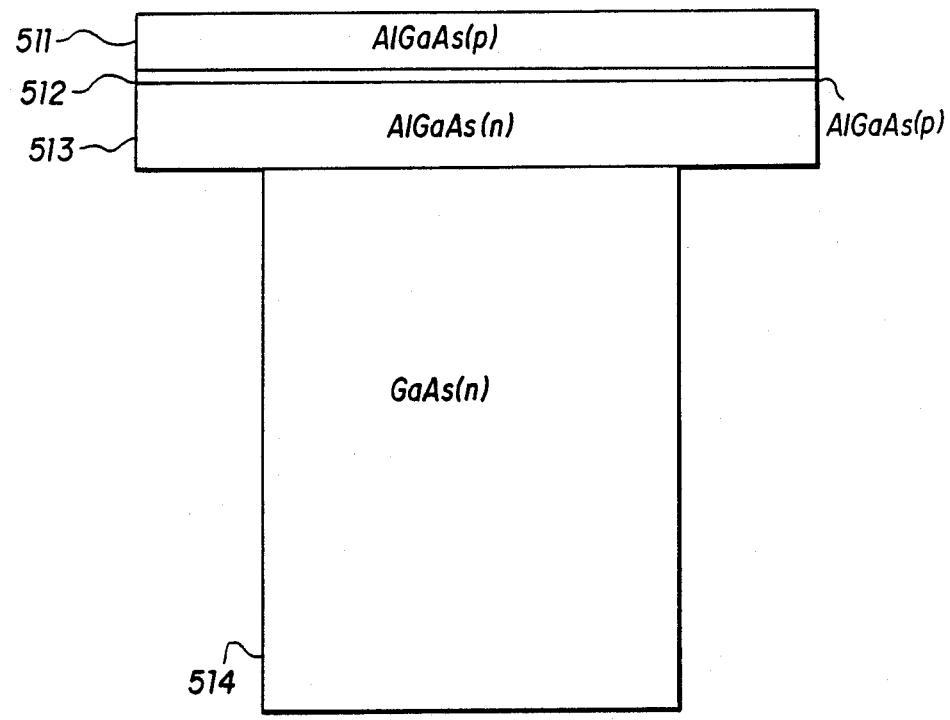

In the LED shown in FIG. 5A substrate 504 is p-doped, layer 503 is p-doped, layer 502 is p-doped and layer 501 is n-doped. However, selection of the doping of the substrate and layers is a matter of design choice. For instance, FIG. 5C shows an alternate embodiment of an LED similar to that shown in FIGS. 5A and 5B. The LED shown in FIG. 5C has a layer 511 of p-doped AlGaAs, a layer 512 of p-doped AlGaAs, and a layer 513 of n-doped AlGaAs grown on a substrate 514 of n-doped GaAs.

The following discussion of FIG. 6 through FIG. 14 describes how the LED diode shown in FIG. 5C may be manufactured in accordance with a preferred embodiment of the present invention.

Figure 6:
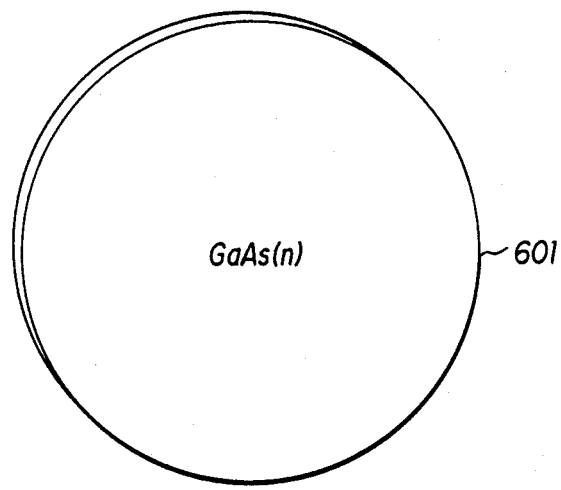
FIGS. 6 and 7 show a two inch diameter wafer made of n-doped gallium arsenide used in the manufacture of light emitting diodes in accordance with a preferred embodiment of the present invention.
Figure 7:
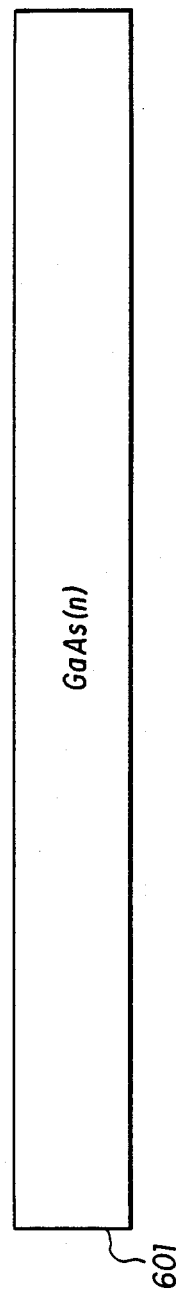

FIG. 6 shows a two inch diameter wafer 601 of n-doped gallium arsenide. Wafer 601 serves as a substrate. FIG. 7 shows a cross-sectional view of wafer 601. Wafer 601 is, for example, sixteen mils thick.

Figure 8:
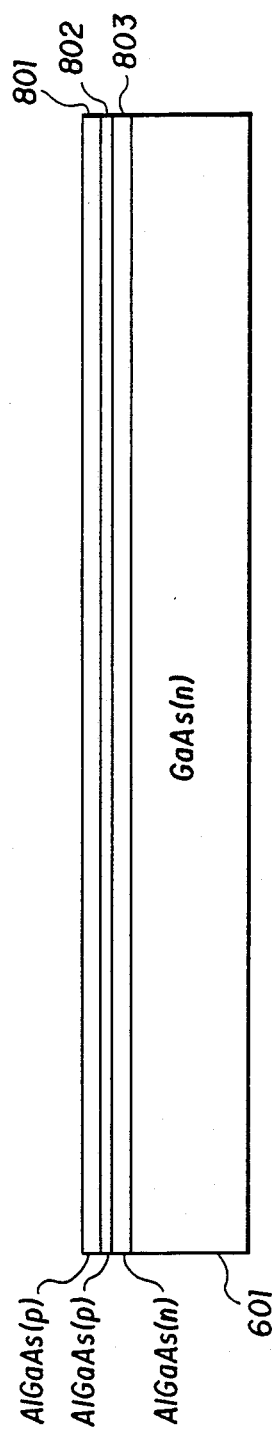
FIG. 8 shows epitaxial layers of aluminum gallium arsenide deposited on the wafer shown in FIG. 6 and FIG. 7, as in the manufacture of a preferred embodiment of the present invention.

As shown in FIG. 8, an epitaxial layer 803 of n-doped AlGaAs, an epitaxial layer 802 of p-doped AlGaAs and an epitaxial layer 801 of p-doped AlGaAs is grown on wafer 601. Layers 801, 802 and 803 may be grown using liquid phase epitaxy. Layers 802 and 801 may be doped with, for instance, zinc or magnesium. Layer 803 may be doped with, for instance tellurium. The bandgap for layer 803 is, for example, 2.091 electron volts (eV) The bandgap for layer 802 is, for example, 1.921 eV. The bandgap for layer 801 is, for example, 2.091 eV. The bandgap for substrate 601 is, for example, 1.424 eV.

Figure 9:
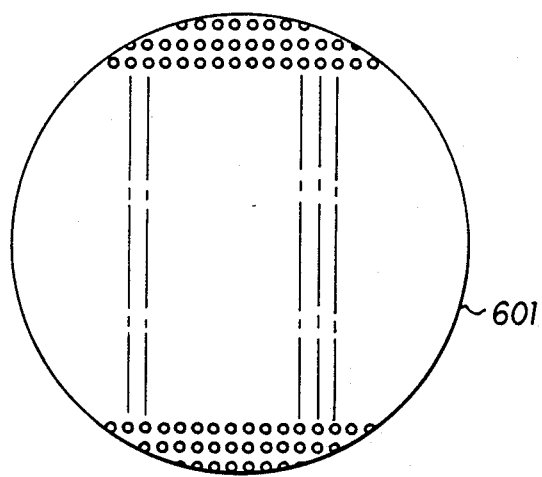
FIGS. 9 and 10 show a layer of aluminum added to the wafer shown in FIG. 8, as in the manufacture of a preferred embodiment of the present invention.

On top of layer 801 are deposited aluminum contacts, as shown in FIG. 9. The contacts are five to six mils in diameter and approximately three microns thick. The distance between contacts is approximately twelve mils. Before depositing the aluminum contacts the top of layer 801 may be diffused with zinc. Then the aluminum contacts may be deposited by evaporation.

Figure 10:
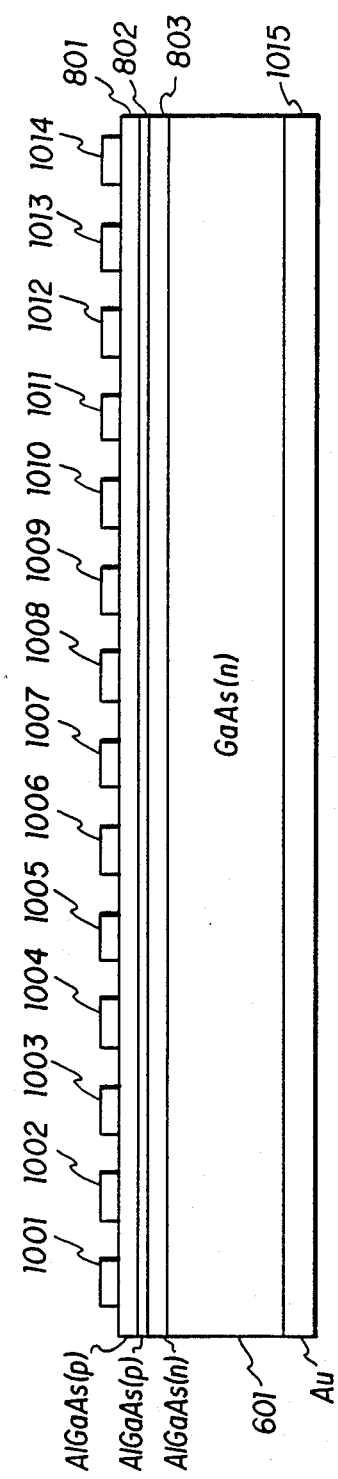

FIG. 10 shows contacts 1001, 1002, 1003, 1004, 1005, 1006, 1007, 1008, 1009, 1010, 1011, 1012, 1013 and 1014 deposited upon layer 801. Upon completion of the deposition of the aluminum contacts, wafer 601 is thinned down to approximately eight mils. This may be done, for instance by etching or lapping the backside of wafer 601. A contact layer 1015 is then deposited on the back of wafer 601. Layer 1015 may, for example, be a composite of gold and germanium deposited by evaporation. The thickness of layer 1015 is, for example. 0.3 microns.

Figure 11:
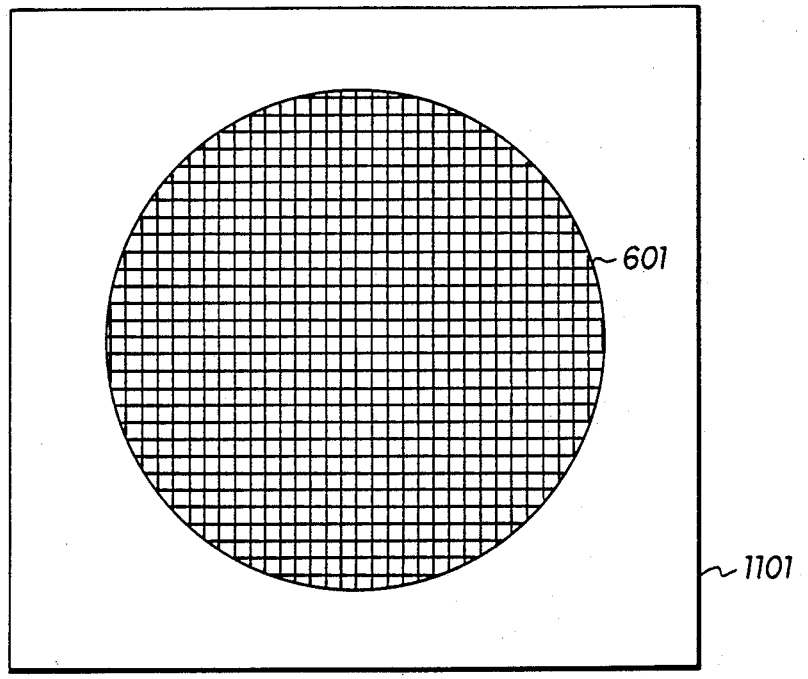
FIG. 11 shows the wafer of FIGS. 9 and 10 cut into 10 mil × 10 mil squares and attached to expandable tape.

Wafer 601 is then sawed up, using diamond saws, into ten by ten mil squares and placed on expandable tape 1101, as shown in FIG. 11. An etch may be used to remove saw damage. Each ten by ten mil square is an LED. Expandable tape 1101, may be, for example, Electron Blue Tape available from Electron Material Technology Inc., 1600 Dell Ave. Suite H, Campbell, Calif. 95008. Layer 1015 is attached to tape 1101. It may be necessary to clean the surface of layer 1015 before attaching expandable tape 1101.

Figure 12:
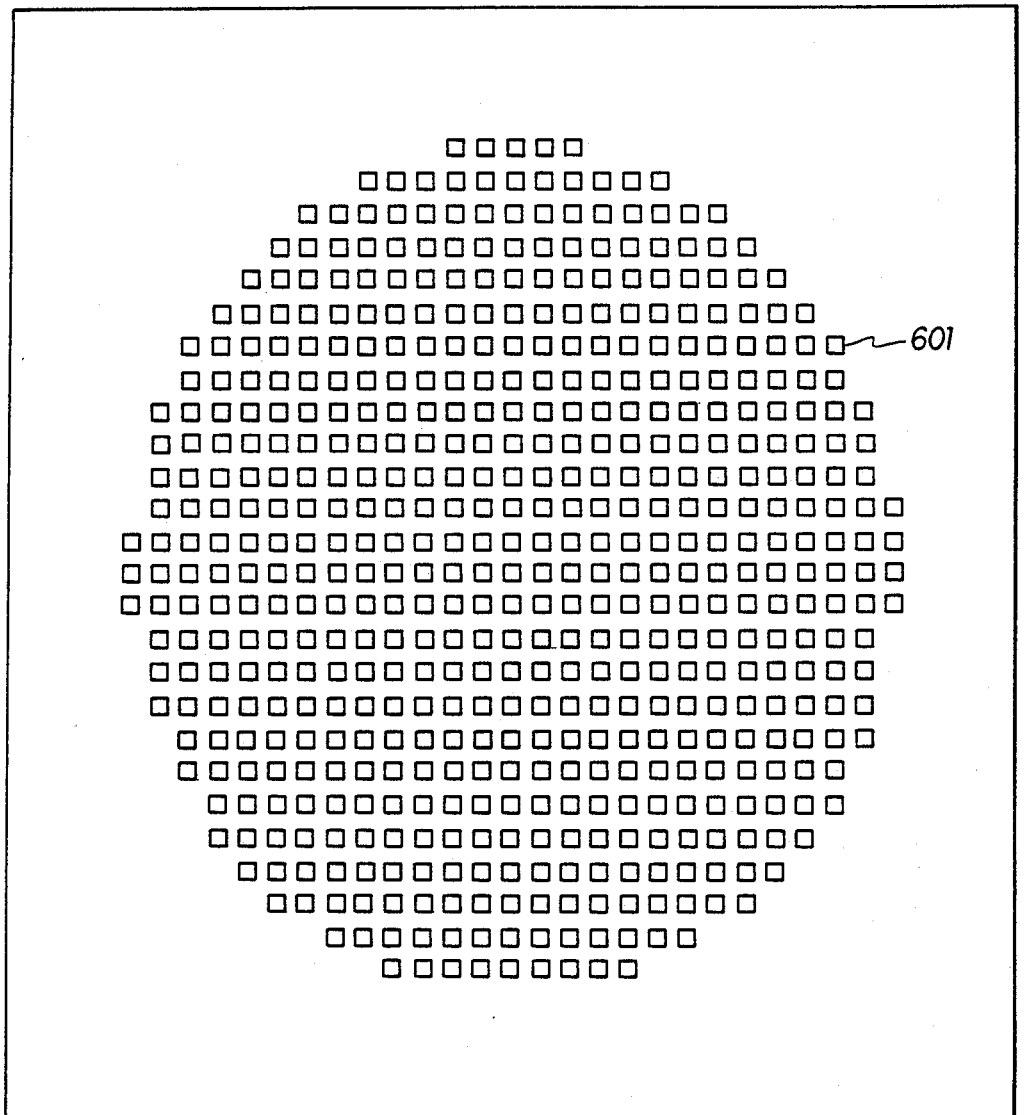
FIG. 12 shows the expandable tape and wafer of FIG. 11 being stretched in preparation for an etch.

Expandable tape 1101 is expanded as shown in FIG. 12, separating the ten by ten mil square (LED) of wafer 601. Wafer 601 is then etched using an etch which selectively etches GaAs material. For instance the spray etch disclosed in U.S. Pat. No. 4,086,126 by A. J. Springthorpe and M. J. Rider, and assigned to Northern Telecom Limited of Canada, may be used. It may be desirable to protect the aluminum contacts during this selective etch. If so, a spin-on glass coating, such as Accuglass, available from Allied Corporate Electronic Chemicals, 1090 S. Milpitas Blvd., Milpitas, Calif. 95035, may be applied to wafer 601 before wafer 601 is sawed up, and may be removed after the selective etch. Upon completion of the selective etch, the produced LEDs are ready for packaging and sale.

Figure 13:
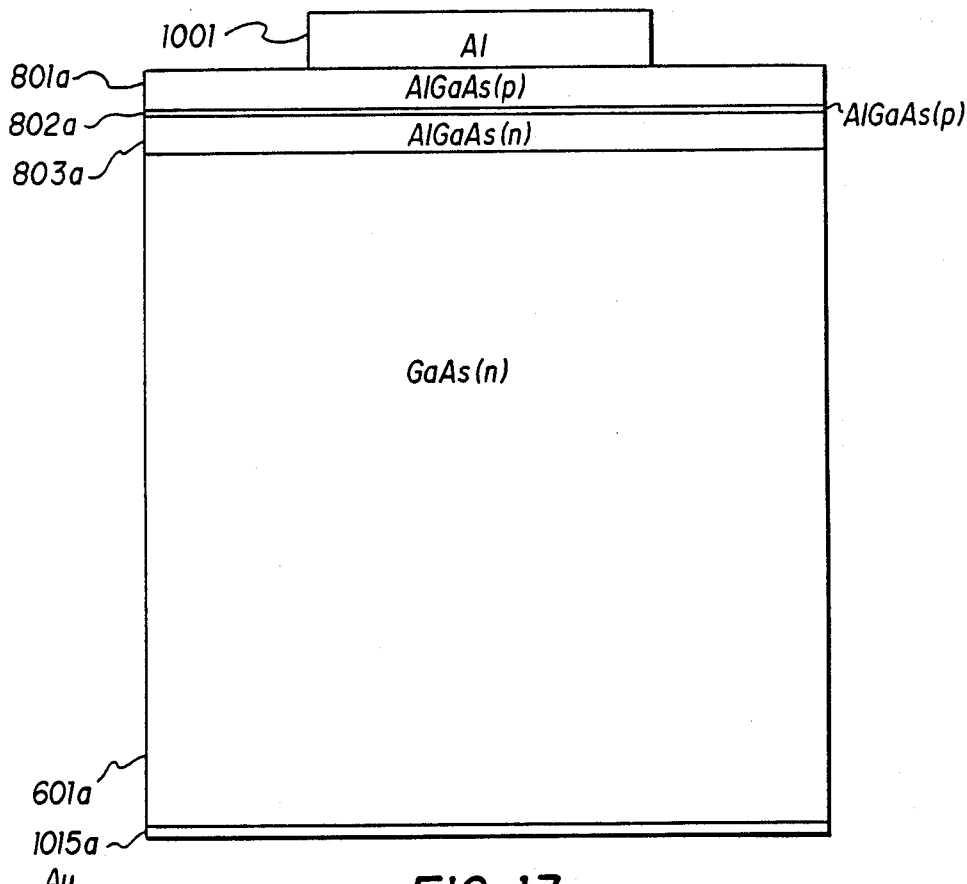
FIG. 13 is a cross section of one of the 10 mil × 10 mil squares of FIGS. 11 and 12, before etching.

FIG. 13 shows an example of an LED before the selective etch. The LED has a layer 801a of p-doped AlGaAs, a layer 802a of p-doped AlGaAs, and a layer 803a of n-doped AlGaAs on substrate 601a of n-doped GaAs. The aluminum contact 1001 and a contact 1015a composed of, for example gold alloyed with germanium, are used to apply current to the LED.

Figure 14:
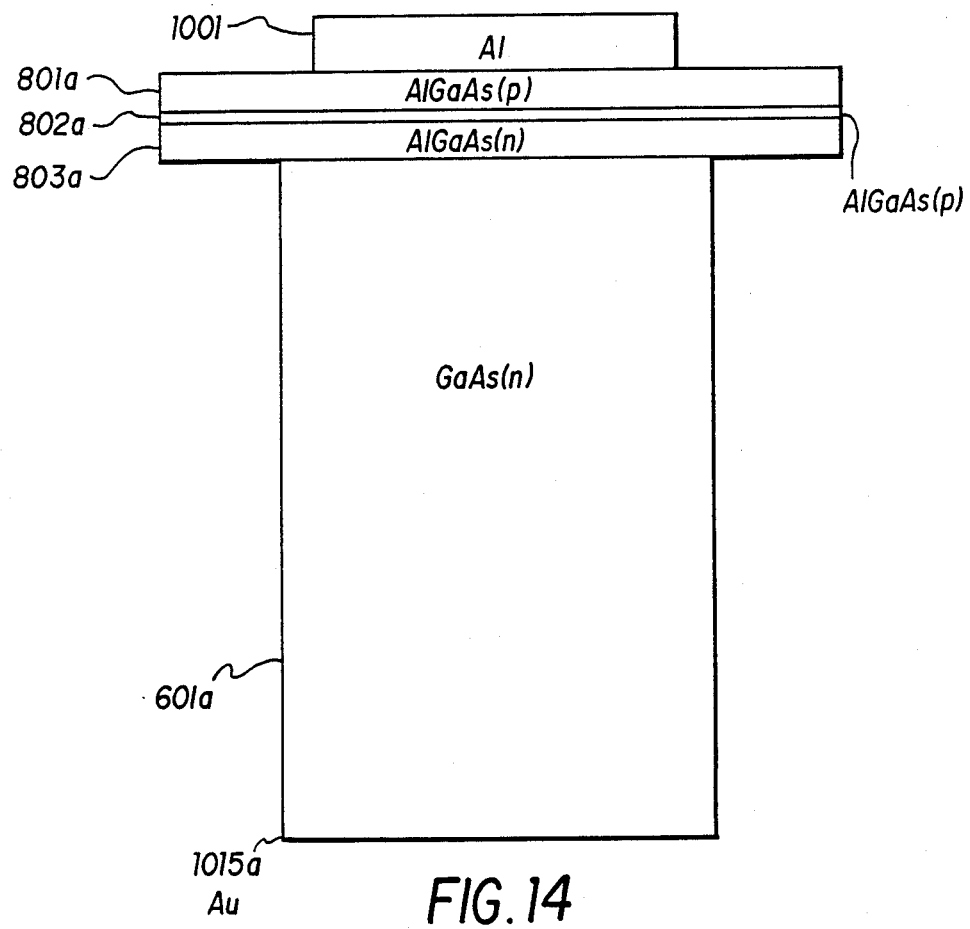
FIG. 14 is a cross section of the 10 mil × 10 mil square of FIG. 13 after etching.

FIG. 14 shows the LED after substrate 601a has been selectively etched to reduce the amount of light absorbed by substrate 601a. Although the selective etch did not dissolve any part of layer 1015a, layer 1015a is typically so thin that upon removal from the expandable tape 1101, the portion of layer 1015a under the etched portion of substrate 601 breaks off.

The LED shown in FIG. 14 has a double heterojunction (DH). Layer 802a is the active layer, and layers 801a and 803a are window layers.

Figure 15:
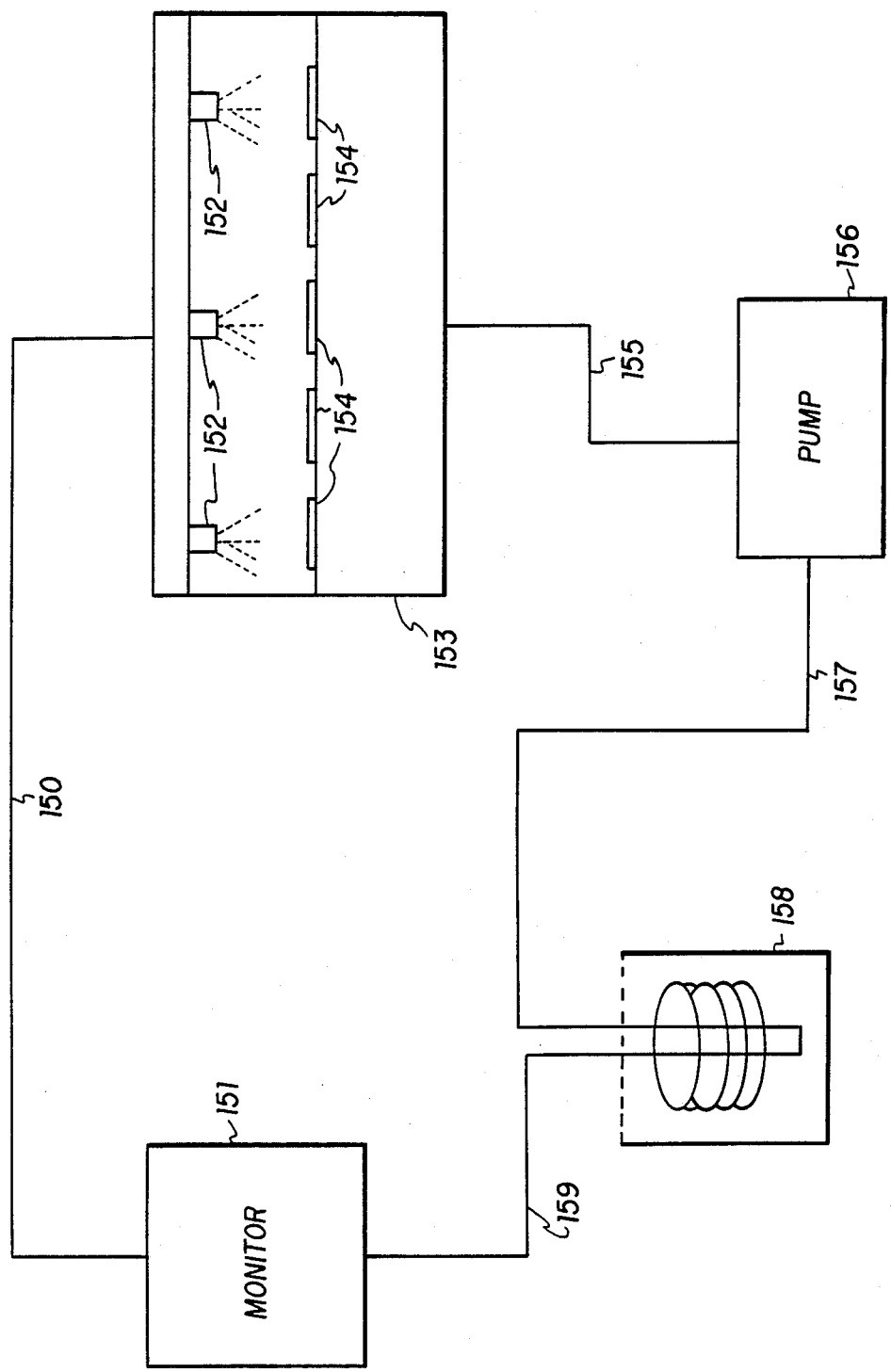
FIG. 15 shows a system which may be used to etch the wafer shown in FIG. 12.

FIG. 15 shows a system which may used to perform the selective etch. In a tub 153 are placed wafers 154. Wafers 154 are in the same condition as wafer 601 after wafer 601 has been expanded using expandable tape 1011. Wafers are spray etched by a liquid etch sprayed out of spray heads 152. The liquid etch is drained from tub 153 through hose 155 into centrifugal pump 156. Centrifugal pump 156 pumps the etch through hose 157, through heat exchanger 158, through hose 159, through monitor 151 and through hose 150 back into spray heads 152. Heat exchanger 158 is used to heat the liquid etch. Monitor 151 is used to monitor pH and temperature of the liquid etch.

I claim:

1. A light emitting diode comprising:
a substrate having a plane surface; and,
a plurality of layers deposited upon the plane surface of the substrate, wherein a first layer from the plurality of layers has a first plane surface, wherein the first layer is deposited on the plane surface of the substrate so that the first plane surface of the first layer is directly on top of the plane surface of the substrate, and wherein the first plane surface of the first layer has a greater area than the plane surface of the substrate so that substantially over the entire perimeter of the surface area at which the substrate is connected to the first layer the first layer extends outward beyond the plane surface of the substrate;
wherein light is generated in one of the plurality of layers along a junction of the one with another of the plurality of layers.

2. A light emitting diode as in claim 1 wherein a second layer of the plurality of layers is deposited directly on top of the first layer so that a first plane surface of the second layer is directly on top of a second plane surface of the first layer.

3. A light emitting diode as in claim 2 wherein the substrate comprises gallium arsenide and wherein the first layer and the second layer comprise aluminum gallium arsenide.

4. A light emitting diode as in claim 2 wherein a third layer of the plurality of layers is deposited directly on top of the second layer so that a first plane surface of the third layer is directly on top of a second plane surface of the second layer.

5. A light emitting diode as in claim 4 wherein the substrate comprises gallium arsenide and wherein the first layer, the second layer and the third layer comprise aluminum gallium arsenide.

6. A light emitting diode comprising:
a substrate of gallium arsenide;
a plurality of aluminum gallium arsenide layers epitaxially deposited upon the substrate; wherein, after deposit of the plurality of aluminum gallium arsenide layers, the substrate is etched to reduce the surface area in which the substrate is connected to the plurality of aluminum gallium arsenide layers so that substantially over the entire perimeter of the surface area at which the substrate is connected to the plurality of aluminum gallium arsenide layers the aluminum gallium arsenide layers extend outward beyond the substrate;
wherein light is generated in a first of the plurality of aluminum gallium arsenide layers along a junction of the first with a second of the aluminium gallium arsenide layers.

7. A light emitting diode as in claim 6 wherein the plurality of aluminum gallium arsenide layers are arranged so as to form a single heterojunction.

8. A light emitting diode as in claim 6 wherein the plurality of aluminum gallium arsenide layers are arranged so as to form a double heterojunction.

* * * * *